United States Patent
Miyamoto et al.

(10) Patent No.: US 11,382,217 B2
(45) Date of Patent: Jul. 5, 2022

(54) SURFACE TREATED COPPER FOIL, COPPER CLAD LAMINATE, AND PRINTED CIRCUIT BOARD

(71) Applicant: JX Nippon Mining & Metals Corporation, Tokyo (JP)

(72) Inventors: Nobuaki Miyamoto, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 315 days.

(21) Appl. No.: 16/498,010

(22) PCT Filed: Apr. 22, 2019

(86) PCT No.: PCT/JP2019/017091
§ 371 (c)(1),
(2) Date: Sep. 26, 2019

(87) PCT Pub. No.: WO2019/208520
PCT Pub. Date: Oct. 31, 2019

(65) Prior Publication Data
US 2021/0362475 A1    Nov. 25, 2021

(30) Foreign Application Priority Data

Apr. 27, 2018   (JP) .............................. JP2018-087551
Apr. 27, 2018   (JP) .............................. JP2018-087554

(Continued)

(51) Int. Cl.
*C25D 7/06* (2006.01)
*H05K 3/38* (2006.01)
(Continued)

(52) U.S. Cl.
CPC ............. *H05K 3/384* (2013.01); *B32B 15/01* (2013.01); *B32B 15/04* (2013.01); *B32B 15/20* (2013.01);
(Continued)

(58) Field of Classification Search
None
See application file for complete search history.

(56) References Cited

U.S. PATENT DOCUMENTS 5,389,446 A    2/1995   Yamanishi et al.
5,456,817 A *  10/1995  Hino ....................... C23C 22/24
                                                               148/241

(Continued)

FOREIGN PATENT DOCUMENTS

EP    2444530 A1    4/2012
JP    2849059 B2    1/1999
(Continued)

OTHER PUBLICATIONS

International Preliminary Report on Patentability dated Nov. 5, 2020 in co-pending PCT application No. PCT/JP2019/017096.
(Continued)

*Primary Examiner* — Seth Dumbris
(74) *Attorney, Agent, or Firm* — Nields, Lemack & Frame, LLC (57) ABSTRACT

A surface treated copper foil 1 includes a copper foil 2, and a first surface treatment layer 3 formed on one surface of the copper foil 2. The first surface treatment layer 3 of the surface treated copper foil 1 has a Ni concentration of 0.1 to 15.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute. A copper clad laminate 10 includes the surface treated copper foil 1 and an
(Continued)

insulating substrate 11 adhered to the first surface treatment layer 3 of the surface treated copper foil 1.

18 Claims, 3 Drawing Sheets

(30) Foreign Application Priority Data

| | | | |
|---|---|---|---|
| May 31, 2018 | (JP) | ............................. | JP2018-105116 |
| Jul. 19, 2018 | (JP) | ............................. | JP2018-136096 |

(51) Int. Cl.

| | |
|---|---|
| *C25D 5/00* | (2006.01) |
| *C25D 5/12* | (2006.01) |
| *B32B 15/04* | (2006.01) |
| *B32B 15/20* | (2006.01) |
| *H05K 1/09* | (2006.01) |
| *H05K 3/02* | (2006.01) |
| *H05K 3/06* | (2006.01) |
| *B32B 15/01* | (2006.01) |
| *C22C 9/04* | (2006.01) |
| *C25D 5/14* | (2006.01) |
| *C25D 3/04* | (2006.01) |
| *C25D 3/12* | (2006.01) |
| *C25D 3/38* | (2006.01) |
| *C25D 3/56* | (2006.01) |
| *C25D 11/38* | (2006.01) |

(52) U.S. Cl.
CPC .................. *C22C 9/04* (2013.01); *C25D 5/12* (2013.01); *C25D 5/605* (2020.08); *C25D 5/627* (2020.08); *H05K 1/09* (2013.01); *H05K 3/022* (2013.01); *H05K 3/06* (2013.01); *B32B 2307/206* (2013.01); *B32B 2457/08* (2013.01); *C25D 3/04* (2013.01); *C25D 3/12* (2013.01); *C25D 3/38* (2013.01); *C25D 3/562* (2013.01); *C25D 5/14* (2013.01); *C25D 11/38* (2013.01); *H05K 2201/0338* (2013.01); *H05K 2201/0355* (2013.01); *H05K 2203/0307* (2013.01); *Y10T 428/12431* (2015.01)

(56) References Cited

U.S. PATENT DOCUMENTS

| | | | |
|---|---|---|---|
| 5,552,234 A | 9/1996 | Kawasumi | |
| 6,319,621 B1 | 11/2001 | Arai et al. | |
| 8,142,905 B2 | 3/2012 | Moriyama et al. | |
| 2002/0053517 A1 | 5/2002 | Endo et al. | |
| 2002/0182433 A1 | 12/2002 | Endo | |
| 2003/0031888 A1 | 2/2003 | Kitano et al. | |
| 2004/0191560 A1* | 9/2004 | Matsuda | C25D 5/627 |
| | | | 428/626 |
| 2010/0212941 A1 | 8/2010 | Higuchi | |
| 2010/0261033 A1 | 10/2010 | Moriyama et al. | |
| 2011/0189501 A1 | 8/2011 | Fujisawa et al. | |
| 2011/0259848 A1 | 10/2011 | Yamanishi et al. | |
| 2011/0262764 A1 | 10/2011 | Arai et al. | |
| 2011/0284496 A1 | 11/2011 | Yamanishi et al. | |
| 2011/0293960 A1 | 12/2011 | Yamanishi et al. | |
| 2011/0297641 A1 | 12/2011 | Yamanishi et al. | |
| 2011/0300401 A1 | 12/2011 | Yamanishi et al. | |
| 2012/0135266 A1 | 5/2012 | Kaminaga | |
| 2012/0148862 A1 | 6/2012 | Moriyama et al. | |
| 2012/0276412 A1 | 11/2012 | Miki | |
| 2013/0011690 A1 | 1/2013 | Arai et al. | |
| 2013/0040162 A1 | 2/2013 | Fujisawa et al. | |
| 2014/0016348 A1 | 1/2014 | Iwasaki | |
| 2014/0057123 A1 | 2/2014 | Arai et al. | |
| 2014/0093743 A1 | 4/2014 | Arai et al. | |
| 2014/0146454 A1 | 5/2014 | Nozawa | |
| 2014/0355229 A1 | 12/2014 | Arai et al. | |
| 2015/0008020 A1 | 1/2015 | Kaneko et al. | |
| 2015/0047884 A1 | 2/2015 | Nagaura et al. | |
| 2015/0079415 A1 | 3/2015 | Fukuchi | |
| 2015/0237737 A1 | 8/2015 | Arai et al. | |
| 2015/0245477 A1 | 8/2015 | Arai et al. | |
| 2016/0189986 A1 | 6/2016 | Kasai et al. | |
| 2016/0242281 A1 | 8/2016 | Nagaura et al. | |
| 2016/0286665 A1 | 9/2016 | Arai et al. | |
| 2016/0303829 A1 | 10/2016 | Arai et al. | |
| 2016/0374205 A1 | 12/2016 | Moriyama et al. | |
| 2017/0032978 A1 | 2/2017 | Moriyama et al. | |
| 2017/0034926 A1 | 2/2017 | Moriyama et al. | |
| 2017/0144355 A1 | 5/2017 | Kuwabara et al. | |
| 2017/0336535 A1 | 11/2017 | Shima et al. | |
| 2018/0160529 A1 | 6/2018 | Arai et al. | |
| 2018/0226655 A1 | 8/2018 | Arai et al. | |
| 2018/0228029 A1 | 8/2018 | Moriyama | |
| 2018/0255646 A1 | 9/2018 | Moriyama | |
| 2018/0288867 A1 | 10/2018 | Fukuchi | |
| 2019/0145014 A1 | 5/2019 | Chen et al. | |
| 2021/0331449 A1 | 10/2021 | Miyamoto et al. | |
| 2021/0337664 A1 | 10/2021 | Miyamoto et al. | |
| 2021/0360785 A1 | 11/2021 | Miyamoto et al. | |

FOREIGN PATENT DOCUMENTS

| | | | | |
|---|---|---|---|---|
| JP | 2011-9267 A | 1/2011 | | |
| JP | 5204908 B1 | 6/2013 | | |
| JP | 2016-010961 A | 1/2016 | | |
| KR | 2012-0135197 A | 12/2012 | | |
| PH | 12014000344 A1 | 6/2016 | | |
| TW | I422484 B | 1/2014 | | |
| TW | 201526726 A | 7/2015 | | |
| TW | I530234 B | 4/2016 | | |
| TW | 201619448 A | 6/2016 | | |
| TW | I619409 B | 3/2018 | | |
| WO | 2010/074053 A1 | 7/2010 | | |
| WO | 2010/074061 A1 | 7/2010 | | |
| WO | 2010/074072 A1 | 7/2010 | | |
| WO | 2010/147013 A1 | 12/2010 | | |
| WO | WO-2011105318 A1 * | 9/2011 | ............. | H05K 3/382 |
| WO | 2016/035604 A1 | 3/2016 | | |
| WO | 2016/038923 A1 | 3/2016 | | |
| WO | 2017/006739 A1 | 1/2017 | | |

OTHER PUBLICATIONS

International Preliminary Report on Patentability dated Nov. 5, 2020 in co-pending PCT application No. PCT/JP2019/017092.
International Preliminary Report on Patentability dated Nov. 5, 2020 in corresponding PCT application No. PCT/JP2019/017091.
International Preliminary Report on Patentability dated Nov. 5, 2020 in co-pending PCT application No. PCT/JP2019/017093.
Office action dated Aug. 13, 2021 in co-pending U.S. Appl. No. 16/498,032.
Office action dated Oct. 13, 2021 in co-pending U.S. Appl. No. 16/498,003.
Office action dated Sep. 28, 2021 in co-pending U.S. Appl. No. 16/497,996.
International Search Report dated Jun. 11, 2019 in co-pending PCT application No. PCT/JP2019/017096.
International Search Report dated Jun. 11, 2019 in co-pending PCT application No. PCT/JP2019/017092.
International Search Report dated Jun. 11, 2019 in corresponding PCT application No. PCT/JP2019/017091.
International Search Report dated Jun. 11, 2019 in co-pending PCT application No. PCT/JP2019/017093.
Korean communication, with English translation, dated Oct. 26, 2021 in co-pending Korean patent application No. 10-2020-7029313.
Final Rejection dated Oct. 28, 2021 in co-pending U.S. Appl. No. 16/498,032.
European communication dated Dec. 7, 2021 in co-pending European patent application No. 19793376.5.

(56) References Cited

OTHER PUBLICATIONS

Notice of Allowance dated Feb. 7, 2022 in co-pending U.S. Appl. No. 16/497,996.
Final rejection dated Jan. 31, 2022 in co-pending U.S. Appl. No. 16/498,003.
Notice of allowance dated Mar. 1, 2022 in co-pending U.S. Appl. No. 16/498,032.
Notice of allowance dated Apr. 27, 2022 in co-pending U.S. Appl. No. 16/498,003.

* cited by examiner

Etching residue

SURFACE TREATED COPPER FOIL, COPPER CLAD LAMINATE, AND PRINTED CIRCUIT BOARD

TECHNICAL FIELD

The present disclosure relates to a surface treated copper foil, a copper clad laminate, and a printed circuit board.

BACKGROUND ART

Associated with the increase of needs in electronic devices, such as reduction in size and enhancement of capability, in recent years, there has been a demand of reduction in pitch (miniaturization) of a circuit pattern (which may be referred to as a conductor pattern) of a printed circuit board mounted on the electronic devices.

Various methods, such as a subtractive method and a semi-additive method, have been known as a production method of the printed circuit board. In the subtractive method among these, an insulating substrate is adhered to a copper foil to form a copper clad laminate, then a resist is coated on the surface of the copper foil and then exposed to form a prescribed resist pattern, and the portion having no resist pattern formed (i.e., the unnecessary portion) is removed by etching, so as to form a circuit pattern.

For addressing the needs of reduction in pitch described above, for example, PTL 1 describes that the surface of a copper foil is subjected to a roughening treatment through copper-cobalt-nickel alloy plating, on which a cobalt-nickel alloy plated layer is then formed, and a zinc-nickel alloy plated layer is further formed thereon, so as to provide a surface treated copper foil that is capable of achieving the reduction in pitch of the circuit pattern.

CITATION LIST

Patent Literature

PTL 1: Japanese Patent No. 2,849,059

SUMMARY OF INVENTION

Technical Problem

However, in the ordinary surface treated copper foil, the etching rate of the surface treatment layer (plated layer) is smaller than the etching rate of the copper foil, and therefore the copper foil is etched in a tapered shape expanding from the surface of the copper foil (top) to the insulating substrate (bottom), so as to lower the etching factor of the circuit pattern. In a circuit pattern having a low etching factor, the space between the circuits adjacent to each other is necessarily increased to make difficult the reduction in pitch of the circuit pattern. The ordinary surface treated copper foil thus has the problem of insufficient circuit formability.

One or more embodiments of the present application have been made for solving the aforementioned problem, and an object thereof is to provide a surface treated copper foil and a copper clad laminate that are excellent in circuit formability.

Another object of one or more embodiments of the present application is to provide a printed circuit board that has a circuit pattern having a reduced pitch.

Solution to Problem

The present inventors have made earnest investigations for solving the problem, and as a result, have found that the circuit formability can be enhanced in such a manner that on a surface treatment layer formed on one surface of a copper foil, the Ni concentration obtained from an XPS depth profile is controlled to a particular range, and thus one or more embodiments of the present application have been completed.

Accordingly, one or more embodiments of the present application relate to a surface treated copper foil including a copper foil, and a first surface treatment layer formed on one surface of the copper foil, wherein the first surface treatment layer has a Ni concentration of 0.1 to 15.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute.

One or more embodiments of the present application also relate to a copper clad laminate including the surface treated copper foil and an insulating substrate adhered to the first surface treatment layer of the surface treated copper foil.

One or more embodiments of the present application also relate to a printed circuit board including a circuit pattern formed by etching the surface treated copper foil of the copper clad laminate.

Advantageous Effects of Invention

According to one or more embodiments of the present application, a surface treated copper foil and a copper clad laminate that are excellent in circuit formability can be provided.

According to one or more embodiments of the present application, a printed circuit board that has a circuit pattern having a reduced pitch can also be provided.

DESCRIPTION OF EMBODIMENTS

One or more preferred embodiments of the present application will be specifically described below, but the one or more embodiments of the present application are not limited thereto and may be subjected to various changes and improvements by a skilled person in the art unless the changes and improvements deviate the one or more embodiments of the present application. The plural constitutional elements described in the one or more embodiments may form various inventions through appropriate combinations thereof. For example, some of the constitutional elements may be deleted from all the constitutional elements shown in the one or more embodiments, and the constitutional elements of other one or more embodiments may be appropriately combined therewith.

Figure 1:
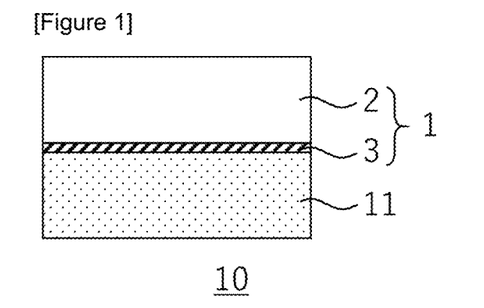
FIG. 1 is a cross sectional view showing a copper clad laminate using a surface treated copper foil of one or more embodiments of the present application.

FIG. 1 is a cross sectional view showing a copper clad laminate using a surface treated copper foil of one or more embodiments of the present application.

The surface treated copper foil 1 has a copper foil 2, and a first surface treatment layer 3 formed on one surface of the copper foil 2. The copper clad laminate 10 has the surface treated copper foil 1 and an insulating substrate 11 adhered to the first surface treatment layer 3 of the surface treated copper foil 1.

The first surface treatment layer 3 has a Ni concentration of 0.1 to 15.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute. In the description herein, the expression "performing sputtering at a sputtering rate of 2.5 nm/min (in terms of $SiO_2$)" means "performing sputtering under condition that in the case where $SiO_2$ is sputtered, $SiO_2$ is sputtered at a sputtering rate of 2.5 nm/min". More specifically, in one or more embodiments of the present application, the expression means that the first surface treatment layer 3 of the surface treated copper foil 1 of one or more embodiments of the present application is sputtered with $Ar^+$ accelerated at 3 kV in high vacuum.

This Ni concentration is the Ni concentration of the first surface treatment layer 3 at a depth of 2.5 nm from the surface thereof, and may be an index of the proportion of Ni in the vicinity of the outermost layer of the first surface treatment layer 3. By controlling the Ni concentration to 15.0 atm % or less, the first surface treatment layer 3 can be readily dissolved in an etching solution, and the etching factor of the circuit pattern can be enhanced. From the standpoint of the stable enhancement of the etching factor, the Ni concentration is preferably controlled to 10.0 atm % or less, more preferably 5.0 atm % or less, and further preferably 3.5 atm % or less. Ni is a component that provides the effects including heat resistance, and therefore by controlling the Ni concentration to 0.1 atm % or more, the effects including heat resistance can be secured. From the standpoint of the stable securement of the effects, the Ni concentration is preferably controlled to 0.5 atm % or more, more preferably 1.0 atm % or more, and further preferably 1.5 atm % or more.

The first surface treatment layer 3 preferably has a Zn concentration of 5.0 to 40.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute.

This Zn concentration is the Zn concentration of the first surface treatment layer 3 at a depth of 2.5 nm from the surface thereof, and may be an index of the proportion of Zn in the vicinity of the outermost layer of the first surface treatment layer 3. By controlling the Zn concentration to 5.0 atm % or more, the first surface treatment layer 3 can be readily dissolved in an etching solution, and the etching factor of the circuit pattern can be enhanced. From the standpoint of the stable enhancement of the etching factor, the Zn concentration is preferably controlled to 10.0 atm % or more, and more preferably 15.0 atm % or more. Zn is a component that provides the effects including heat resistance and chemical resistance, but a too high concentration thereof may decrease the effects. Furthermore, Zn is a component that is relatively readily dissolved in hydrochloric acid, and thus may provide a possibility of infiltration to the bottom of the circuit (i.e., between the first surface treatment layer 3 of the surface treated copper foil 1 and the insulating substrate 11) with a copper chloride etching solution, which is a hydrochloric system. As a result, there may be a possibility that the adhesion between the copper circuit and the insulating substrate 11 is lowered to cause defects including separation of circuits. Accordingly, from the standpoint of the prevention of the separation of circuits and the like while securing the heat resistance, the chemical resistance, and the like by Zn, the Zn concentration is controlled to 40.0 atm % or less. From the standpoint of the stable achievement of the effects, the Zn concentration is preferably controlled to 35 atm % or less, and more preferably 30 atm % or less.

The first surface treatment layer 3 preferably has an integrated value of a Ni concentration of 0.1 to 18.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

This integrated value of a Ni concentration is the integrated value of a Ni of the first surface treatment layer 3 at a depth of 2.5 to 5.0 nm from the surface thereof, and may be an index of the proportion of Ni in the vicinity of the outermost layer of the first surface treatment layer 3. By controlling the integrated value of a Ni concentration to 18.0 atm % or less, the first surface treatment layer 3 can be readily dissolved in an etching solution, and the etching factor of the circuit pattern can be enhanced. From the standpoint of the stable enhancement of the etching factor, the integrated value of a Ni concentration is preferably controlled to 15.0 atm % or less, more preferably 10.0 atm % or less, and further preferably 8.0 atm % or less. By controlling the integrated value of a Ni concentration to 0.1 atm % or more, the effects including heat resistance can be secured. From the standpoint of the stable securement of the effects including the heat resistance, the integrated value of a Ni concentration is preferably controlled to 0.5 atm % or more, more preferably 1.0 atm % or more, and further preferably 1.5 atm % or more.

The first surface treatment layer 3 preferably has an integrated value of a Zn concentration of 5.0 to 40.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

This integrated value of a Zn concentration is the integrated value of a Zn concentration of the first surface treatment layer 3 at a depth of 2.5 to 5.0 nm from the surface thereof, and may be an index of the proportion of Zn in the vicinity of the outermost layer of the first surface treatment layer 3. By controlling the integrated value of a Zn concentration to 5.0 atm % or more, the first surface treatment layer 3 can be readily dissolved in an etching solution, and the etching factor of the circuit pattern can be enhanced. From the standpoint of the stable enhancement of the etching factor, the integrated value of a Zn concentration is preferably controlled to 10.0 atm % or more, and more preferably 12.0 atm % or more. By controlling the integrated value of a Zn concentration to 40.0 atm % or less, the effects including heat resistance and chemical resistance can be secured. From the standpoint of the stable securement of the effects, the integrated value of a Zn concentration is preferably controlled to 38 atm % or less, and more preferably 35 atm % or less.

The first surface treatment layer 3 preferably has a sum of integrated values of Ni and Zn concentrations of 10.0 to 45.0 atm % based on the total amount of elements of C, N, O, Zn, Cr, Ni, Co, Si, and Cu (which may be hereinafter referred simply to as a "sum of integrated values of Ni and Zn concentrations", in an XPS depth profile obtained by performing sputtering at a sputtering rate of 2.5 nm/min (in terms of $SiO_2$) in a period of 1 minute to 2 minutes.

This sum of integrated values may be an index of the proportion of Ni and Zn in the vicinity of the outermost layer of the first surface treatment layer 3. By controlling the sum of integrated values to 10.0 atm % or more, the effects including heat resistance and chemical resistance can be secured. From the standpoint of the stable securement of the effects, the sum of integrated values is preferably controlled to 15.0 atm % or more, and more preferably 20.0 atm % or more. By controlling the sum of integrated values to 45.0 atm % or less, the etching factor can be stably enhanced while achieving the effects including heat resistance and chemical resistance. From the standpoint of the stable securement of the effects, the sum of integrated values is preferably controlled to 40 atm % or less, and more preferably 38 atm % or less.

The first surface treatment layer 3 preferably has a Cu concentration of 70 to 98 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 7 minutes.

This Cu concentration is the Cu concentration of the first surface treatment layer 3 at a depth of 17.5 nm from the surface thereof, and may be an index of the proportion of copper in the vicinity of the outermost layer. By controlling the Cu concentration to 70 atm % or more, the solubility thereof to an etching solution can be increased, and an effect of enhancing the etching factor can be obtained. From the standpoint of the stable securement of the effect, the Cu concentration is preferably controlled to 80 atm % or more, and more preferably 90 atm % or more. By controlling the Cu concentration to 98 atm % or less, the characteristics including the heat resistance and the chemical resistance can be prevented from being deteriorated. From the standpoint of the stable securement of the effects, the Cu concentration is preferably controlled to 97 atm % or less, and more preferably 96 atm % or less.

In the case where the Cu concentration, i.e., the Cu concentration of the first surface treatment layer 3 at a depth of 17.5 nm from the surface thereof, is as high as 70 atm % or more as described above, the etching of the first surface treatment layer 3 rapidly proceeds in etching the surface treated copper foil 1, in which by controlling the sum of integrated values of Ni and Zn, which is the proportion of Ni and Zn in the vicinity of the outermost layer of the first surface treatment layer 3 to 10.0 to 45.0 atm %, preferably 15.0 to 40 atm %, and more preferably 20.0 to 38 atm %, both the high etching factor and the securement of the heat resistance and the chemical resistance can be simultaneously achieved to a high level. In the case where the high heat resistance can be retained, in the case for example that the surface treated copper foil 1 is bonded to the insulating substrate 11, the peel strength thereof to the insulating substrate 11 can be retained even after heating. Furthermore, the content of a magnetic metal (such as Ni and Co) in the first surface treatment layer 3 can be decreased, and therefore, the surface treated copper foil 1 can be favorably used as a copper foil for forming a high frequency signal circuit, the applications of which is being enhanced in recent years.

The first surface treatment layer 3 preferably has a ten-point average roughness Rz according to JIS B0601:1994 of 0.4 to 1.2 μm. By controlling the ten-point average roughness Rz to this range, both the enhancement of the adhesion of the first surface treatment layer 3 to the insulating substrate 11 and the enhancement of the etching factor can be simultaneously achieved. From the standpoint of the stable securement of the effects, the ten-point average roughness Rz of the first surface treatment layer 3 is more preferably from 0.5 to 0.9 μm.

The first surface treatment layer 3 preferably has a root mean square height Sq of 0.32 μm or less, and more preferably 0.30 μm or less. The root mean square height Sq is an index showing the average amplitude in the height direction of the surface. In the case where the root mean square height Sq is increased, the surface becomes rough, and the adhesion of the first surface treatment layer 3 to the insulating substrate 11 is enhanced, but the etching factor tends to decrease. Accordingly, both the enhancement of the adhesion of the first surface treatment layer 3 to the insulating substrate 11 and the enhancement of the etching factor can be simultaneously achieved by controlling the root mean square height Sq to the range. The lower limit of the root mean square height Sq is not particularly limited, and is preferably 0.20 μm or more.

The first surface treatment layer 3 preferably has a reduced valley depth Svk of 0.38 μm or less, and more preferably 0.35 μm or less. The reduced valley depth Svk is an index showing the average depth of valleys below the core roughness profile. In the case where the reduced valley depth Svk is increased, the surface becomes rough, and the adhesion of the first surface treatment layer 3 to the insulating substrate 11 is enhanced, but the etching factor tends to decrease. Accordingly, both the enhancement of the adhesion of the first surface treatment layer 3 to the insulating substrate 11 and the enhancement of the etching factor can be simultaneously achieved by controlling the reduced valley depth Svk to the range. The lower limit of the reduced valley depth Svk is not particularly limited, and is preferably 0.31 μm or more.

Svk of the first surface treatment layer 3 relates to the etching residue. The etching residue is a residue that remains on the insulating substrate 11 around the circuit pattern after forming the circuit pattern by etching, and can be confirmed with an SEM micrograph (magnification: 3,000) of the circuit pattern shown in FIG. 2. A large amount of the etching residue is not preferred from the standpoint of the reduction in pitch of the circuit pattern since short circuit tends to occur in a circuit pattern with a small circuit width. Therefore, Svk is preferably within the range for reducing the etching residue.

The first surface treatment layer 3 preferably has an average length of roughness curve elements RSm according to JIS B0601:2013 of 5 to 10 μm.

RSm herein is an index showing the average distance of the irregular shape of the surface. In general, in the case where the size of particles forming the first surface treatment layer 3 is increased, RSm is increased since the distances of the irregular shape of the surface are expanded. In the case where RSm is increased, the adhesion force of the surface treated copper foil 1 to the insulating substrate is increased, but portions remaining undissolved in the etching treatment tend to occur. Accordingly, a circuit pattern having a trapezoidal shape with a trailing bottom portion tends to occur in the etching treatment, and therefore, the etching factor tends to decrease. In the case where the size of particles forming the first surface treatment layer 3 is decreased, a tendency opposite to the above tends to occur. Accordingly, the etching factor is enhanced, but the adhesion force of the surface treated copper foil 1 to the insulating substrate tends to decrease.

For achieving both the enhancement of the adhesion force to the insulating substrate and the enhancement of the etching capability simultaneously, RSm of the first surface treatment layer 3 is preferably controlled to the range. The surface of the first surface treatment layer 3 can have a surface shape that is suitable for achieving both the enhancement of the adhesion force to the insulating substrate and the enhancement of the etching capability simultaneously by controlling RSm in this manner. Specifically, the irregular shape of the surface of the first surface treatment layer 3 can be formed in a well balanced manner, and therefore, the etching factor of the circuit pattern and the adhesion to the insulating substrate can be enhanced. From the standpoint of the stable securement of the effects, RSm is preferably controlled to 5 to 9 µm.

The first surface treatment layer 3 preferably has an average length of roughness motifs AR according to JIS B0631:2000 of 6 to 20 µm.

AR herein is an index showing the fine irregular shape of the surface. In general, in the case where the size of particles forming the first surface treatment layer 3 is increased, AR is increased since the distances of the irregular shape of the surface are expanded. In the case where AR is increased, the adhesion force of the surface treated copper foil 1 to the insulating substrate is increased, but portions remaining undissolved in the etching treatment tend to occur. Accordingly, a circuit pattern having a trapezoidal shape with a trailing bottom portion tends to occur in the etching treatment, and therefore, the etching factor tends to decrease. In the case where the size of particles forming the first surface treatment layer 3 is decreased, a tendency opposite to the above tends to occur. Accordingly, the etching factor is enhanced, but the adhesion force of the surface treated copper foil 1 to the insulating substrate tends to decrease.

For achieving both the enhancement of the adhesion force to the insulating substrate and the enhancement of the etching capability simultaneously, AR of the first surface treatment layer 3 is preferably controlled to the range. The surface of the first surface treatment layer 3 can have a surface shape that is suitable for achieving both the enhancement of the adhesion force to the insulating substrate and the enhancement of the etching capability simultaneously by controlling AR in this manner. Specifically, the irregular shape of the surface of the first surface treatment layer 3 can be formed in a well balanced manner, and therefore, the etching factor of the circuit pattern and the adhesion to the insulating substrate can be enhanced. From the standpoint of the stable securement of the effects, AR is preferably controlled to 7 to 18 µm.

The first surface treatment layer 3 preferably has a* of a CIE L*a*b* color space measured according to the geometric condition C of JIS Z8730:2009 (which may be hereinafter referred to as "a*") of 3.0 to 28.0. a* is a value expressing red color, and copper exhibits color close to red. Accordingly, by controlling a* to the range, the amount of copper in the first surface treatment layer 3 can be controlled to a range that provides good solubility in the etching solution, and therefore, the etching factor of the circuit pattern can be enhanced. From the standpoint of the stable securement of the effect, a* is preferably controlled to 5.0 to 23.0.

The first surface treatment layer 3 preferably has L* of a CIE L*a*b* color space measured according to the geometric condition C of JIS Z8730:2009 (which may be hereinafter referred to as "L*") of 39.0 to 94.0. L* is an index that mainly relates to monochrome, and has a relationship to the amount of Zn regulating the heat resistance. Zn has characteristics of readily dissolving in the etching solution as compared to Ni as described later, and therefore, by controlling L* to the range, the amount of Zn influencing the heat resistance and the etching factor can be controlled to a suitable range. Consequently, the etching factor of the circuit pattern can be enhanced. From the standpoint of the stable securement of the effect, L* is preferably controlled to 44.0 to 84.0, and more preferably controlled to 54.0 to 70.0.

The first surface treatment layer 3 preferably contains at least Ni and Zn as deposited elements.

Ni is a component that is hardly soluble in the etching solution, and therefore, by controlling the deposited amount of Ni of the first surface treatment layer 3 to 200 µg/dm$^2$ or less, the first surface treatment layer 3 becomes readily soluble in the etching solution. As a result, the etching factor of the circuit pattern can be enhanced. From the standpoint of the stable enhancement of the etching factor, the deposited amount of Ni of the first surface treatment layer 3 is preferably controlled to 180 µg/dm$^2$ or less, and more preferably 100 µg/dm$^2$ or less. From the standpoint of the securement of the prescribed effects (such as the heat resistance) by the first surface treatment layer 3, the deposited amount of Ni of the first surface treatment layer 3 may be controlled to 20 µg/dm$^2$ or more.

A surface treatment, such as gold plating, may be performed in some cases after forming the circuit pattern, and in the case where soft etching is performed as a pretreatment for removing unnecessary substances from the surface of the circuit pattern, the soft etching solution may infiltrate to the edge portion of the circuit pattern in some cases. Ni has an effect of preventing the infiltration of the soft etching solution. From the standpoint of the sufficient securement of the effect, the deposited amount of Ni of the first surface treatment layer 3 is preferably controlled to 30 µg/dm$^2$ or more, and more preferably controlled to 40 µg/dm$^2$ or more.

Zn is readily soluble in the etching solution as compared to Ni, and therefore, a relatively large amount thereof may be deposited. Accordingly, by controlling the deposited amount of Zn of the first surface treatment layer 3 to 1,000 µg/dm$^2$ or less, the first surface treatment layer 3 becomes readily soluble, and thereby the etching factor of the circuit pattern can be enhanced. From the standpoint of the stable enhancement of the etching factor, the deposited amount of Zn of the first surface treatment layer 3 is preferably controlled to 700 µg/dm$^2$ or less, and more preferably controlled to 600 µg/dm$^2$ or less. From the standpoint of the securement of the prescribed effects (such as the heat resistance and the chemical resistance) by the first surface treatment layer 3, the deposited amount of Zn of the first surface treatment layer 3 may be controlled to 20 µg/dm$^2$ or more, preferably 100 µg/dm$^2$ or more, and more preferably 300 µg/dm$^2$ or more. For example, Zn has a barrier effect of preventing heat diffusion of copper, and thus can suppress the roughening particles and copper in the copper foil from being exposed to the surface layer through the heat diffusion. As a result, copper can be prevented from being in direct contact with a chemical solution, such as a soft etching solution, and thereby the soft etching solution can be suppressed from infiltrating to the edge portion of the circuit pattern.

The first surface treatment layer 3 may contain elements, such as Co and Cr, as deposited elements, in addition to Ni and Zn.

The deposited amount of Co of the first surface treatment layer 3 is not particularly limited since the deposited amount thereof depends on the kind of the first surface treatment layer 3, and is preferably 1,500 µg/dm$^2$ or less, more preferably 500 µg/dm$^2$ or less, further preferably 100 µg/dm$^2$ or less, and particularly preferably 30 µg/dm$^2$ or less. By controlling the deposited amount of Co of the first surface treatment layer 3 to the range, the etching factor of the circuit pattern can be stably enhanced. The lower limit of the deposited amount of Co is not particularly limited, and is typically 0.1 µg/dm$^2$, and is preferably 0.5 µg/dm$^2$.

Since Co is a magnetic metal, the surface treated copper foil 1 that is capable of producing a printed circuit board excellent in high frequency characteristics can be obtained by suppressing the deposited amount of Co of the first surface treatment layer 3 particularly to 100 µg/dm$^2$ or less, and preferably 0.5 to 100 µg/dm$^2$.

The deposited amount of Cr of the first surface treatment layer 3 is not particularly limited since the deposited amount thereof depends on the kind of the first surface treatment layer 3, and is preferably 500 µg/dm$^2$ or less, more preferably from 0.5 to 300 µg/dm$^2$, and further preferably from 1 to 100 µg/dm$^2$. By controlling the deposited amount of Cr of the first surface treatment layer 3 to the range, a rust preventing effect can be obtained, and simultaneously the etching factor of the circuit pattern can be stably enhanced.

The kind of the first surface treatment layer 3 is not particularly limited, and various surface treatment layers having been known in this field of art may be used. Examples of the surface treatment layer used as the first surface treatment layer 3 include a roughening treatment layer, a heat resistant layer, a rust preventing layer, a chromate treatment layer, and a silane coupling treatment layer. These layers may be used solely or as a combination of two or more kinds thereof. Among these, the first surface treatment layer 3 preferably includes a roughening treatment layer from the standpoint of the adhesion to the insulating substrate 11.

In the description herein, the "roughening treatment layer" is a layer that is formed through a roughening treatment, and includes a layer of roughening particles. In the roughening treatment, there are some cases where ordinary copper plating or the like may be performed as a pretreatment thereof, and ordinary copper plating or the like may be performed as a finishing treatment for preventing the roughening particles from dropping off, and the "roughening treatment layer" in the description herein includes the layers formed through the pretreatment and the finishing treatment.

The roughening particles are not particularly limited, and may be formed of an elemental substance selected from the group consisting of copper, nickel, cobalt, phosphorus, tungsten, arsenic, molybdenum, chromium, and zinc, or an alloy containing at least one thereof. After forming the roughening particles, a roughening treatment may further be performed by providing secondary particles or tertiary particles formed of an elemental substance or an alloy of nickel, cobalt, copper, or zinc, or the like.

The roughening treatment layer may be formed through electroplating, the condition for which is not particularly limited, and the condition may be typically as follows. The electroplating may be performed by dividing into two stages.

Plating solution composition: 10 to 20 g/L of Cu and 50 to 100 g/L of sulfuric acid Plating solution temperature: 25 to 50° C.

Electroplating condition: current density of 1 to 60 A/dm$^2$ and a time of 1 to 10 seconds The heat resistant layer and the rust preventing layer are not particularly limited, and may be formed of materials having been known in this field of art. The heat resistant layer may function as the rust preventing layer in some cases, and therefore, one layer having both the functions of the heat resistant layer and the rust preventing layer may be formed as the heat resistant layer and the rust preventing layer.

The heat resistant layer and/or the rust preventing layer may be a layer that contains at least one element (which may be in the form of any of a metal, an alloy, an oxide, a nitride, a sulfide, and the like) selected from the group consisting of nickel, zinc, tin, cobalt, molybdenum, copper, tungsten, phosphorus, arsenic, chromium, vanadium, titanium, aluminum, gold, silver, a platinum group element, iron, and tantalum. Examples of the heat resistant layer and/or the rust preventing layer include a layer containing a nickel-zinc alloy.

The heat resistant layer and the rust preventing layer may be formed through electroplating, the condition for which is not particularly limited, and the condition for a typical heat resistant layer (Ni—Zn layer) may be as follows.

Plating solution composition: 1 to 30 g/L of Ni and 1 to 30 g/L of Zn

Plating solution pH: 2 to 5

Plating solution temperature: 30 to 50° C.

Electroplating condition: current density of 1 to 10 A/dm$^2$ and a time of 0.1 to 5 seconds The chromate treatment layer is not particularly limited, and may be formed of materials having been known in this field of art.

In the description herein, the "chromate treatment layer" means a layer that is formed with a solution containing chromic anhydride, chromic acid, dichromic acid, a chromate salt, or a dichromate salt. The chromate treatment layer may be a layer that contains an element (which may be in the form of any of a metal, an alloy, an oxide, a nitride, a sulfide, and the like) of cobalt, iron, nickel, molybdenum, zinc, tantalum, copper, aluminum, phosphorus, tungsten, tin, arsenic, titanium, or the like. Examples of the chromate treatment layer include a chromate treatment layer that is formed by treating with a chromic anhydride or potassium dichromate aqueous solution, and a chromate treatment layer that is formed by treating with a treatment solution containing chromic anhydride or potassium dichromate, and zinc.

The chromate treatment layer may be formed by a known method, such as a dip chromate treatment and an electrolytic chromate treatment. The condition therefor is not particularly limited, and the condition for a typical dip chromate treatment layer is as follows.

Chromate solution composition: 1 to 10 g/L of $K_2Cr_2O_7$ and 0.01 to 10 g/L of Zn Chromate solution pH: 2 to 5

Chromate solution temperature: 30 to 50° C.

The silane coupling treatment layer is not particularly limited, and may be formed of materials having been known in this field of art.

In the description herein, the "silane coupling treatment layer" means a layer that is formed with a silane coupling agent.

The silane coupling agent is not particularly limited, and materials having been known in this field of art may be used. Examples of the silane coupling agent include an amino silane coupling agent, an epoxy silane coupling agent, a mercapto silane coupling agent, a methacryloxy silane coupling agent, a vinyl silane coupling agent, an imidazole silane coupling agent, and a triazine silane coupling agent. Among these, an amino silane coupling agent and an epoxy silane coupling agent are preferred. The silane coupling agent may be used solely or as a combination of two or more kinds thereof.

The silane coupling agent may be produced by a known method, and a commercially available product may also be used. Examples of the commercially available product that can be used as the silane coupling agent include KBM Series and KBE Series, produced by Shin-Etsu Chemical Co., Ltd. The commercially available product of the silane coupling agent may be used solely, and from the standpoint of the adhesion (peel strength) between the first surface treatment layer 3 and the insulating substrate 11, a mixture of two or more kinds of the silane coupling agents is preferably used. Examples of the preferred mixture of silane coupling agents among these include a mixture of KBM 603 (N-2-(aminoethyl)-3-aminopropyltrimethoxysilane) and KBM 503 (3-methacryloxypropyltrimethoxysilane), a mixture of KBM 602 (N-2-(aminoethyl)-3-aminopropyldimethoxysilane) and KBM 503 (3-methacryloxypropyltrimethoxysilane), a mixture of KBM 603 (N-2-(aminoethyl)-3-aminopropyltrimethoxysilane) and KBE 503 (3-methacryloxypropyltriethoxysilane), a mixture of KBM 602 (N-2-(aminoethyl)-3-aminopropyldimethoxysilane) and KBE 503 (3-methacryloxypropyltriethoxysilane), a mixture of KBM 903 (3-aminopropyltrimethoxysilane) and KBM 503 (3-methacryloxypropyltrimethoxysilane), a mixture of KBE 903 (3-aminotriethoxysilane) and KBM 503 (3-methacryloxypropyltrimethoxysilane), a mixture of KBE 903 (3-aminotriethoxysilane) and KBE 503 (3-methacryloxypropyltriethoxysilane), and a mixture of KBM 903 (3-aminopropyltrimethoxysilane) and KBE 503 (3-methacryloxypropyltriethoxysilane).

In the case where a mixture of two or more kinds of the silane coupling agents is used, the mixing ratio thereof is not particularly limited and may be appropriately controlled depending on the kinds of the silane coupling agents used.

Figure 3:
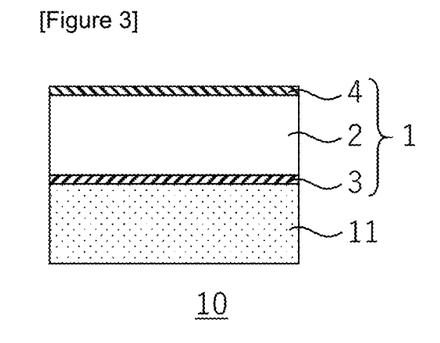
FIG. 3 is a cross sectional view showing a copper clad laminate using a surface treated copper foil further having a second surface treatment layer of one or more embodiments of the present application.

As shown in FIG. 3, the surface treated copper foil 1 may further have a second surface treatment layer 4 on the opposite surface of the copper foil 2.

The kind of the second surface treatment layer 4 is not particularly limited, and as similar to the first surface treatment layer 3, various surface treatment layers having been known in this field of art may be used. The kind of the second surface treatment layer 4 may be the same as or different from the kind of the first surface treatment layer 3.

The second surface treatment layer 4 may contain elements, such as Ni, Zn, and Cr, as deposited elements.

The ratio of the deposited amount of Ni of the first surface treatment layer 3 to the deposited amount of Ni of the second surface treatment layer 4 is preferably from 0.01 to 2.5, and more preferably from 0.6 to 2.2. Ni is a component that is hardly soluble in the etching solution, and therefore, by controlling the ratio of the deposited amounts of Ni to the range, the dissolution of the first surface treatment layer 3 becoming the bottom of the circuit pattern can be enhanced, and the dissolution of the second surface treatment layer 4 becoming the top of the circuit pattern can be suppressed, in etching the copper clad laminate 10. Accordingly, a circuit pattern that has a small difference between the top width and the bottom width and has a high etching factor can be provided.

The deposited amount of Ni of the second surface treatment layer 4 is not particularly limited since the deposited amount depends on the kind of the second surface treatment layer 4, and is preferably from 0.1 to 500 $\mu g/dm^2$, more preferably from 0.5 to 200 $\mu g/dm^2$, and further preferably from 1 to 100 $\mu g/dm^2$. By controlling the deposited amount of Ni of the second surface treatment layer 4 to the range, the etching factor of the circuit pattern can be stably enhanced.

The deposited amount of Zn of the second surface treatment layer 4 is not particularly limited since the deposited amount depends on the kind of the second surface treatment layer 4, and in the case where the second surface treatment layer 4 contains Zn, is preferably from 10 to 1,000 $\mu g/dm^2$, more preferably from 50 to 500 $\mu g/dm^2$, and further preferably from 100 to 300 $\mu g/dm^2$. By controlling the deposited amount of Zn of the second surface treatment layer 4 to the range, effects including the heat resistance and the chemical resistance can be obtained, and the etching factor of the circuit pattern can be stably enhanced.

The deposited amount of Cr of the second surface treatment layer 4 is not particularly limited since the deposited amount depends on the kind of the second surface treatment layer 4, and in the case where the second surface treatment layer 4 contains Cr, is preferably more than 0 $\mu g/dm^2$ and 500 $\mu g/dm^2$ or less, more preferably from 0.1 to 100 $\mu g/dm^2$, and further preferably from 1 to 50 $\mu g/dm^2$. By controlling the deposited amount of Cr of the second surface treatment layer 4 to the range, the rust preventing effect can be obtained, and the etching factor of the circuit pattern can be stably enhanced.

The copper foil 2 is not particularly limited, and may be either an electrolytic copper foil or a rolled copper foil. An electrolytic copper foil is generally produced by electrolytically depositing copper from a copper sulfate plating bath onto a titanium or stainless steel drum, and has a flat S surface (shine surface) formed on the side of the drum and an M surface (matt surface) on the opposite side to the S surface. In general, the M surface of the electrolytic copper foil has irregularity, and the adhesion between the first surface treatment layer 3 and the insulating substrate 11 can be enhanced by forming the first surface treatment layer 3 on the M surface, and forming the second surface treatment layer 4 on the S surface.

The material of the copper foil 2 is not particularly limited, and in the case where the copper foil 2 is a rolled copper foil, high purity copper that is generally used as a circuit pattern of a printed circuit board, such as tough pitch copper (JIS H3100, alloy number: C1100) and oxygen-free copper (JIS H3100, alloy number: C1020, or JIS H3510, alloy number: C1011), may be used. Furthermore, for example, copper alloys, such as Sn-containing copper, Ag-containing copper, a copper alloy containing Cr, Zr, or Mg, and a Corson copper alloy containing Ni and Si, may also be used. In the description herein, the "copper foil 2" is a concept including a copper alloy foil.

The thickness of the copper foil 2 is not particularly limited, and may be, for example, from 1 to 1,000 μm, or from 1 to 500 μm, or from 1 to 300 μm, or from 3 to 100 μm, or from 5 to 70 μm, or from 6 to 35 μm, or from 9 to 18 μm.

The surface treated copper foil 1 having the aforementioned structure may be produced according to a method having been known in this field of art. The deposited amounts of Ni and the ratio of the deposited amounts of Ni of the first surface treatment layer 3 and the second surface treatment layer 4 can be controlled, for example, by changing the kinds, the thickness, and the like of the surface treatment layers formed. The ten-point average roughness Rz of the first surface treatment layer 3 can be controlled, for example, by controlling the formation condition and the like of the first surface treatment layer 3.

The copper clad laminate 10 can be produced by adhering the insulating substrate 11 to the first surface treatment layer 3 of the surface treated copper foil 1.

The insulating substrate 11 is not particularly limited, and materials having been known in this field of art may be used.

Examples of the insulating substrate 11 include a paper base impregnated with a phenol resin, a paper base impregnated with an epoxy resin, a synthetic fiber base impregnated with an epoxy resin, a glass cloth-paper composite base impregnated with an epoxy resin, a glass cloth-glass nonwoven cloth composite base impregnated with an epoxy resin, glass cloth base impregnated with an epoxy resin, a polyester film, a polyimide film, a liquid crystal polymer, and a fluorine resin.

The adhesion method of the surface treated copper foil 1 and the insulating substrate 11 is not particularly limited, and the adhesion may be performed by a method having been known in this field of art. For example, the surface treated copper foil 1 and the insulating substrate 11 may be laminated and subjected to thermocompression bonding.

The copper clad laminate 10 produced in the aforementioned manner may be used for the production of a printed circuit board. The production method of the printed circuit board is not particularly limited, and a known method, such as a subtractive method and a semi-additive method, may be used. Among these, the copper clad laminate 10 is optimum for the production by a subtractive method.

Figure 4:
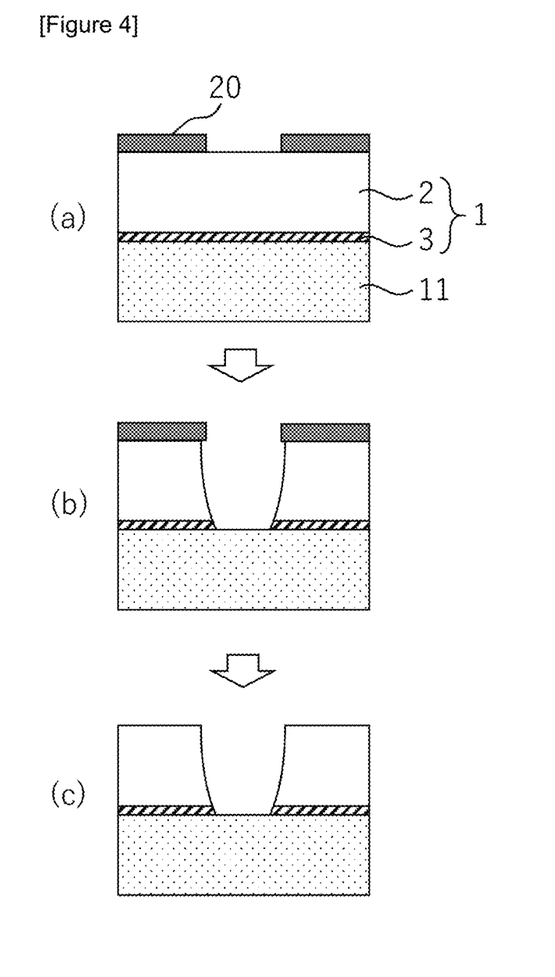
FIG. 4 is a cross sectional view showing a production method of a printed circuit board by a subtractive method.

FIG. 4 is a cross sectional view showing a production method of a printed circuit board by a subtractive method.

In FIG. 4, firstly, a resist is coated on the surface of the surface treated copper foil 1 of the copper clad laminate 10, and then exposed and developed to form a prescribed resist pattern 20 (step (a)). Subsequently, the surface treated copper foil 1 on the portion having no resist pattern 20 formed (i.e., the unnecessary portion) is removed by etching (step (b)). Finally, the resist pattern 20 on the surface treated copper foil 1 is removed (step (c)).

The conditions in the subtractive method are not particularly limited, and the method may be performed under conditions having been known in this field of art.

EXAMPLES

One or more embodiments of the present application will be described more specifically with reference to examples below, but one or more embodiments of the present application are not limited to the examples.

Example 1

A rolled copper foil having a thickness of 12 μm (HA-V2 Foil, produced by JX Nippon Mining & Metals Corporation) was prepared. On one surface of the copper foil, a roughening treatment layer, a heat resistant layer, a chromate treatment layer, and a silane coupling treatment layer were serially formed as the first surface treatment layer, and on the other surface thereof, a heat resistant layer and a chromate treatment layer were serially formed as the second surface treatment layer, so as to provide a surface treated copper foil. The conditions for forming the layers were as follows.
<Roughening Treatment Layer of First Surface Treatment Layer>
The roughening treatment layer was formed by electroplating. The electroplating was performed by dividing to two stages.
(Condition for First Stage)
Plating solution composition: 11 g/L of Cu and 50 g/L of sulfuric acid
Plating solution temperature: 25° C.
Electroplating condition: current density of 42.7 A/dm$^2$ and a time of 1.4 seconds (Condition for Second Stage)
Plating solution composition: 20 g/L of Cu and 100 g/L of sulfuric acid
Plating solution temperature: 50° C.
Electroplating condition: current density of 3.8 A/dm$^2$ and a time of 2.8 seconds
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 1.1 A/dm$^2$ and a time of 0.7 second
<Chromate Treatment Layer of First Surface Treatment Layer>
The chromate treatment layer was formed by electroplating.
Plating solution composition: 3.0 g/L of $K_2Cr_2O_7$ and 0.33 g/L of Zn
Plating solution pH: 3.6
Plating solution temperature: 50° C.
Electroplating condition: current density of 2.1 A/dm$^2$ and a time of 1.4 seconds
<Silane Coupling Treatment Layer of First Surface Treatment Layer>
A 1.2 vol % aqueous solution of N-2-(aminoethyl)-3-aminopropyltrimethoxysilane (KBM 603, Shin-Etsu Chemical Co., Ltd.) (pH: 10) was coated and dried to form the silane coupling treatment layer.
<Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.8 A/dm$^2$ and a time of 0.7 second
<Chromate Treatment Layer of Second Surface Treatment Layer>
The chromate treatment layer was formed by a dip chromate treatment.
Chromate solution composition: 3.0 g/L of $K_2Cr_2O_7$ and 0.33 g/L of Zn
Chromate solution pH: 3.6
Chromate solution temperature: 50° C.

Example 2

A surface treated copper foil was obtained in the same manner as in Example 1 except that the formation condition of the heat resistant layer of the first surface treatment layer was changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.6 A/dm$^2$ and a time of 0.7 second Example 3

A surface treated copper foil was obtained in the same manner as in Example 1 except that the formation condition of the heat resistant layer of the first surface treatment layer was changed as follows.

<Heat Resistant Layer of First Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 4.2 A/dm$^2$ and a time of 0.7 second Example 4

A surface treated copper foil was obtained in the same manner as in Example 1 except that the formation conditions of the heat resistant layers of the first surface treatment layer and the second surface treatment layer were changed as follows.

<Heat Resistant Layer of First Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.1 A/dm$^2$ and a time of 0.7 second <Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.8 A/dm$^2$ and a time of 0.7 second Comparative Example 1

A rolled copper foil having a thickness of 12 μm (HA-V2 Foil, produced by JX Nippon Mining & Metals Corporation) was prepared. On one surface of the copper foil, a roughening treatment layer, a heat resistant layer, a chromate treatment layer, and a silane coupling treatment layer were serially formed as the first surface treatment layer, and on the other surface thereof, a heat resistant layer and a chromate treatment layer were serially formed as the second surface treatment layer, so as to provide a surface treated copper foil. The conditions for forming the layers were as follows.

<Roughening Treatment Layer of First Surface Treatment Layer>

The roughening treatment layer was formed by electroplating.

Plating solution composition: 15 g/L of Cu, 7.5 g/L of Co, and 9.5 g/L of Ni

Plating solution pH: 2.4

Plating solution temperature: 36° C.

Electroplating condition: current density of 31.5 A/dm$^2$ and a time of 1.8 seconds <Heat Resistant Layer (1) of First Surface Treatment Layer>

The heat resistant layer (1) was formed by electroplating.

Plating solution composition: 3 g/L of Co and 13 g/L of Ni

Plating solution pH: 2.0

Plating solution temperature: 50° C.

Electroplating condition: current density of 19.1 A/dm$^2$ and a time of 0.4 second <Heat Resistant Layer (2) of First Surface Treatment Layer>

The heat resistant layer (2) was formed by electroplating.

Plating solution composition: 23.5 g/L of Ni and 4.5 g/L of Zn

Plating solution pH: 3.6

Plating solution temperature: 40° C.

Electroplating condition: current density of 3.5 A/dm$^2$ and a time of 0.4 second <Chromate Treatment Layer of First Surface Treatment Layer>

The chromate treatment layer was formed by a dip chromate treatment.

Chromate solution composition: 3.0 g/L of $K_2Cr_2O_7$ and 0.33 g/L of Zn

Chromate solution pH: 3.6

Chromate solution temperature: 50° C.

<Silane Coupling Treatment Layer of First Surface Treatment Layer>

A 1.2 vol % aqueous solution of N-2-(aminoethyl)-3-aminopropyltrimethoxysilane (KBM 603, Shin-Etsu Chemical Co., Ltd.) (pH: 10) was coated and dried to form the silane coupling treatment layer.

<Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 4.1 A/dm$^2$ and a time of 0.4 second <Chromate Treatment Layer of Second Surface Treatment Layer>

The chromate treatment layer was formed by a dip chromate treatment.

Chromate solution composition: 3.0 g/L of $K_2Cr_2O_7$ and 0.33 g/L of Zn

Chromate solution pH: 3.6

Chromate solution temperature: 50° C.

The surface treated copper foils obtained in Examples and Comparative Example above were subjected to the following evaluations.

<Measurement of Deposited Amounts of Elements in First Surface Treatment Layer and Second Surface Treatment Layer>

The deposited amounts of Ni, Zn, and Co were measured in such a manner that the surface treatment layer was dissolved in nitric acid having a concentration of 20 mass %, and subjected to quantitative analysis by the atomic absorption method with an atomic absorption spectrometer produced by Varian, Inc. (Model AA240FS). The deposited amount of Cr was measured in such a manner that the surface treatment layer was dissolved in hydrochloric acid having a concentration of 7 mass %, and subjected to quantitative analysis by the atomic absorption method in the same manner as above.

<Evaluation of First Surface Treatment Layer of Surface Treated Copper Foil by XPS Depth Profile>

In this evaluation, the Ni concentration, the Zn concentration, and the Cu concentration at the prescribed depths of the first surface treatment layer were measured. The integrated value of a Ni concentration and the integrated value of a Zn concentration were calculated based on the aforementioned measured values.

The Ni concentration and the Zn concentration were measured in such a manner that the first surface treatment layer of the surface treated copper foil was subjected to XPS analysis in the depth direction, and the concentrations of Ni and Zn based on the total amount of the measured elements were measured when sputtering was performed at a sputtering rate of 2.5 nm/min (in terms of $SiO_2$) for 1 minute.

The Cu concentration was measured in such a manner that the first surface treatment layer of the surface treated copper foil was subjected to XPS analysis in the depth direction, and the concentration of Cu based on the total amount of the measured elements was measured when sputtering was performed at a sputtering rate of 2.5 nm/min (in terms of $SiO_2$) for 7 minutes.

The integrated values of a Ni concentration and a Zn concentration were measured in such a manner that the first surface treatment layer of the surface treated copper foil was subjected to XPS analysis in the depth direction, the concentrations of Ni and Zn based on the total amount of the measured elements were measured in a period of 1 minute to 2 minutes when sputtering was performed at a sputtering rate of 2.5 nm/min (in terms of $SiO_2$), and the integrated value was calculated in the method described later. A specific example of the calculation is shown below for the calculation method for the integrated value of a Ni concentration for example, and the integrated value of a Zn concentration can be measured in the similar manner.

Figure 5:
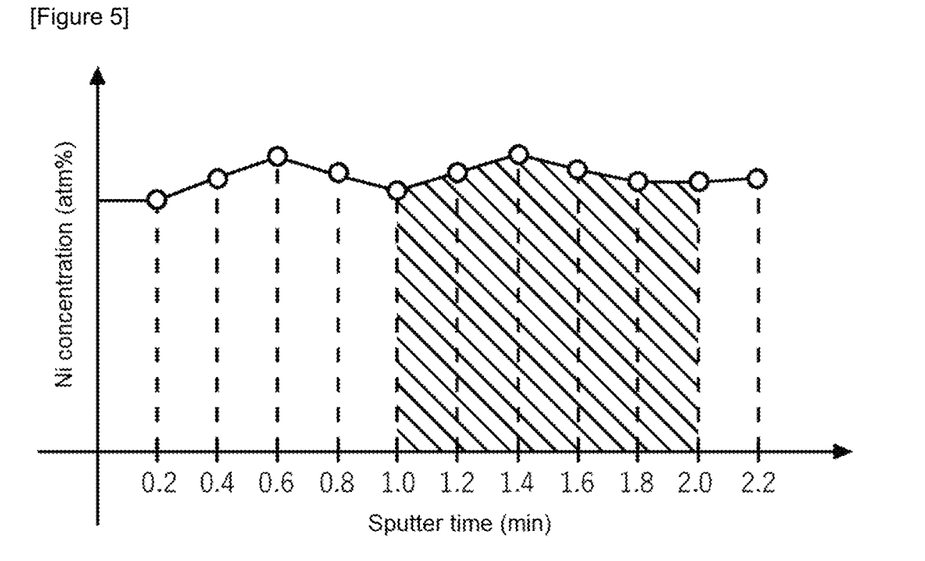
FIG. 5 is a schematic illustration for explaining the calculation method of an integrated value of a Ni concentration.

The Ni concentrations were taken every 0.2 minute of sputter time in the XPS analysis, and a graph was provided by plotting the sputter time as the abscissa and the Ni concentration as the ordinate. Subsequently, diagrams approximating trapezoids were drawn, and the area of the diagrams was obtained to calculate the integrated value of a Ni concentration in performing sputtering in a period of 1 minute to 2 minutes. At this time, the Ni concentration was taken up to $10^{-4}$ digit and subjected to the calculation. One example of the diagrams approximating trapezoids are shown in FIG. 5. In FIG. 5, the hatched area is the area of the portion corresponding to the integrated value of a Ni concentration in performing sputtering in a period of 1 minute to 2 minutes. FIG. 5 is only an illustration for explaining the calculation method of the integrated value of a Ni concentration, but does not show the measurement results of the examples described herein.

The other condition for the XPS depth profile was as follows.

Equipment: 5600MC, produced by Ulvac-Phi, Inc.
Ultimate vacuum degree: $5.7 \times 10^{-7}$ Pa
Excitation source: monochromatized MgKα
Output power: 400 W
Detection area: 800 μm in diameter
Incident angle: 81°
Take off angle: 45°
Neutralization gun: none
Element to be measured: C, N, O, Zn, Cr, Ni, Co, Si, and Cu <Sputtering Condition>
Ion species: $Ar^+$
Acceleration voltage: 3 kV
Sweep area: 3 mm×3 mm <Measurement of Rz of First Surface Treatment Layer of Surface Treated Copper Foil>

Rz (ten-point average roughness) was measured according to JIS B0601:1994 with a contact roughness meter, Surfcorder SE-3C, produced by Kosaka Laboratory, Ltd. The measurement was performed with a measurement reference length of 0.8 mm, an evaluation length of 4 mm, a cutoff value of 0.25 mm, and a feed speed of 0.1 mm/sec, 10 times while changing the measurement position in the width direction of the surface treated copper foil, and the average value of the 10 measured values was designated as the evaluation result.

<Measurement of Sq, Svk, RSm, and AR of First Surface Treatment Layer of Surface Treated Copper Foil>

Sq (root mean square height), Svk (reduced valley depth), RSm (average length of roughness curve elements), and AR (average length of roughness motifs) were measured with a laser microscope (LEXT OLS4000), produced by Olympus Corporation. The measurements of RSm and AR were performed according to JIS B0601:2013 and JIS B0631:2000 respectively. For each of Sq, Svk, RSm, and AR, the average value of measured values at arbitrary 10 positions was designated as the evaluation result. The temperature in the measurement was from 23 to 25° C. The major set condition in the laser microscope was as follows.

Objective lens: MPLAPON 50LEXT (magnification: 50, numerical aperture: 0.95, immersion medium: air, mechanical tube length: 00, cover glass thickness: 0, field number: FN18)

Scanning mode: high precision in XYZ (height resolution: 10 nm) Image capture size (number of pixels): 257 μm crosswise×258 μm lengthwise (1024×1024) (corresponding to 257 μm as evaluation length in measurement in crosswise direction)

DIC: off
Multilayer: off
Laser intensity: 100
Offset: 0
Confocal level: 0
Beam diameter limiting: off
Image average: 1
Noise reduction: on
Brightness unevenness correction: on
Optical noise filter: on
Cutoff: none (none in all λc, λs, λf)
Filter: Gaussian filter
Noise removal: premeasurement
Tilt correction: performed
Identification value of minimum height: 10% of Rz
Motif parameter: upper limit height of roughness motif A/upper limit height of waviness motif B=0.1 mm/0.5 mm <Measurement of a* and L* of First Surface Treatment Layer of Surface Treated Copper Foil> a* and L* of CIE L*a*b* color space were measured according to JIS Z8730:2009 with MiniScan (registered trade name) EZ Model 4000L, produced by Hunter Associates Laboratory, Inc. as a measuring equipment. Specifically, the first surface treatment layer of the surface treated copper foil obtained in Examples and Comparative Examples was pressed on the sensor of the measuring equipment to cut off external light, and a* thereof was measured. The measurement of a* and L* was performed according to the geometric condition C of JIS Z8722. The major set condition in the measuring equipment was as follows.

Optical system: d/8°, integrating sphere size: 63.5 mm, observation light source: D65
Measurement method: reflection
Illumination diameter: 25.4 mm
Measurement diameter: 20.0 mm
Measurement wavelength and interval: 400 to 700 nm, 10 nm
Light source: pulse xenon lamp, one pulse per measurement
Traceability standard: calibration according to National Institute of Standards and Technology (NIST) based on CIE 44 and ASTM E259
Standard observer: 10°
The white tile as the measurement reference had the following object color.

X: 81.90, Y: 87.02, Z: 93.76 in CIE XYZ color space measured at D65/10° (corresponding to L*: 94.8, a*: −1.6, b*: 0.7 in CIE L*a*b* color space)

<Evaluation of Etching Factor and Etching Residue>

A polyimide substrate was laminated on the first surface treatment layer of the surface treated copper foil and subjected to thermocompression bonding at 300° C. for 1 hour, so as to produce a copper clad laminate. A photosensitive resist was coated on the second surface treatment layer of the surface treated copper foil, and then exposed and developed to form a resist pattern having widths L/S=29 μm/21 μm. Thereafter, the exposed portion (i.e., the unnecessary portion) of the surface treated copper foil was removed by etching, so as to provide a printed circuit board having a copper circuit pattern having widths L/S=25 μm/25 μm. The widths L and S of the circuit pattern were the widths of the bottom of the circuit, i.e., the surface thereof in contact with the polyimide substrate. The etching was performed by spray etching under the following condition.

Etching solution: copper chloride etching solution (copper(II) chloride dihydrate: 400 g/L, 35% hydrochloric acid: 200 mL/L)

Solution temperature: 45° C.

Spray pressure: 0.18 MPa

Subsequently, the circuit pattern formed was observed with SEM, and the etching factor (EF) was obtained according to the following expression.

$$EF = (\text{circuit height})/((\text{circuit bottom width} - \text{circuit top width})/2)$$

A larger value of the etching factor means a larger tilt angle of the side wall of the circuit.

The value of EF was an average value of the results of five experiments for each of Examples and Comparative Example.

Figure 2:
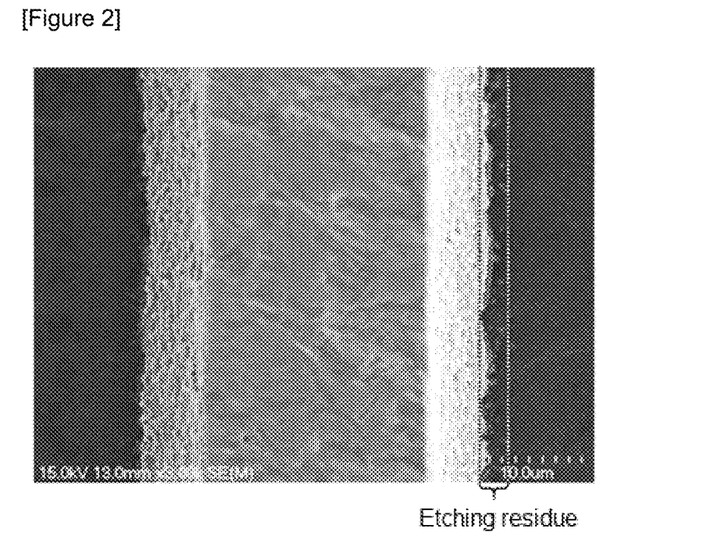
FIG. 2 is an SEM micrograph showing a circuit pattern for explaining the etching residue.

The etching residue was evaluated by the occurrence state thereof from an SEM micrograph of the circuit pattern with a magnification of 3,000. Specifically, as shown in FIG. 2, straight lines were drawn perpendicular to the circuit pattern, and the maximum value of the distances from the bottom of the circuit pattern to the positions where the etching residue was formed was obtained to evaluate the etching residue. In this evaluation, a specimen having the maximum value of the distance of 1 μm or less was evaluated as "good", and a specimen having the maximum value of the distance exceeding 1 μm was evaluated as "poor".

<Evaluation of Peel Strength>

The 90° peel strength was measured according to JIS C6471:1995. Specifically, the strength was measured when the circuit (surface treated copper foil) having a width of 3 mm was peeled at the interface between the commercially available substrate (FR-4 prepreg) and the surface treated copper foil at an angle of 90° and a rate of 50 mm/min. The measurement was performed twice, and the average value thereof was designated as the result of the peel strength. A peel strength of 0.5 kgf/cm or more can be said to provide good adhesion between the conductor and the substrate.

The circuit width was prepared by the ordinary subtractive etching method using a copper chloride etching solution. The peel strength was evaluated under two conditions, i.e., in the initial stage (immediately after etching) and after a heat history corresponding to solder reflow (260° C., 20 seconds).

The evaluation results are shown in Tables 1 to 3.

TABLE 1

|  | First surface treatment layer | | | | Second surface treatment layer | | |
| --- | --- | --- | --- | --- | --- | --- | --- |
|  | Deposited amount of Ni (μg/dm²) | Deposited amount of Zn (μg/dm²) | Deposited amount of Co (μg/dm²) | Deposited amount of Cr (μg/dm²) | Deposited amount of Ni (μg/dm²) | Deposited amount of Zn (μg/dm²) | Deposited amount of Cr (μg/dm²) |
| Example 1 | 52 | 166 | 0 | 50 | 67 | 321 | 22 |
| Example 2 | 93 | 419 | 0 | 48 | 67 | 321 | 22 |
| Example 3 | 146 | 615 | 0 | 50 | 67 | 321 | 22 |
| Example 4 | 77 | 346 | 0 | 50 | 67 | 321 | 22 |
| Comparative Example 1 | 830 | 260 | 2280 | 79 | 64 | 288 | 19 |

TABLE 2

|  | Ni concentration (atm %) | Zn concentration (atm %) | Cu concentration (atm %) | Integrated value of Ni concentration (1) (atm %) | Integrated value of Zn concentration (2) (atm %) | (1) + (2) (atm %) |
| --- | --- | --- | --- | --- | --- | --- |
| Example 1 | 1.7 | 18.8 | 94.8 | 2.5 | 13.5 | 16.0 |
| Example 2 | 2.7 | 26.8 | 93.1 | 5.4 | 24.9 | 30.3 |
| Example 3 | 3.2 | 29.7 | 94.6 | 7.1 | 34.0 | 41.1 |
| Example 4 | 2.3 | 26.7 | 91.9 | 5.3 | 24.2 | 29.5 |
| Comparative Example 1 | 18.6 | 15.3 | 67.3 | 20.4 | 11.1 | 31.5 |

TABLE 3

| | Rz (μm) | Sq (μm) | Svk (μm) | RSm (μm) | AR (μm) | a* | L* | EF | Etching residue | Peel strength (kgf/cm) Initial | Peel strength (kgf/cm) after heat history |
|---|---|---|---|---|---|---|---|---|---|---|---|
| Example 1 | 0.74 | 0.24 | 0.32 | 6.89 | 9.60 | 21.19 | 69.51 | 3.5 | good | 0.66 | 0.62 |
| Example 2 | 0.66 | 0.20 | 0.33 | 8.65 | 9.46 | 12.04 | 66.31 | 4.0 | good | 0.66 | 0.62 |
| Example 3 | 0.73 | 0.26 | 0.32 | 7.50 | 10.00 | 5.58 | 61.79 | 3.7 | good | 0.66 | 0.62 |
| Example 4 | 0.72 | 0.24 | 0.31 | 7.14 | 7.34 | 13.24 | 68.26 | 3.6 | good | 0.64 | 0.61 |
| Comparative Example 1 | 0.68 | 0.28 | 0.40 | 4.22 | 5.47 | 1.55 | 37.58 | 2.6 | poor | 0.71 | 0.69 |

As shown in Tables 1 to 3, the surface treated copper foils of Examples 1 to 4 each having a Ni concentration of the first surface treatment layer of 0.1 to 15.0 atm % exhibited a high etching factor, but the surface treated copper foil of Comparative Example 1 having a Ni concentration of the first surface treatment layer exceeding 15.0 atm % exhibited a low etching factor. Examples 1 to 4 each exhibited a high peel strength and less etching residue.

It is understood from the aforementioned results that one or more embodiments of the present application can provide a surface treated copper foil and a copper clad laminate that are excellent in circuit formability. Furthermore, one or more embodiments of the present application can also provide a printed circuit board that has a circuit pattern having a reduced pitch.

One or more embodiments of the present application may also be in the following embodiments.

<1>
A surface treated copper foil including a copper foil, and a first surface treatment layer formed on one surface of the copper foil,
wherein the first surface treatment layer has a Ni concentration of 0.1 to 15.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute.

<2>
The surface treated copper foil according to the item <1>, wherein the Ni concentration is from 1.0 to 3.5 atm %.

<3>
The surface treated copper foil according to the item <1> of <2>,
wherein the first surface treatment layer has a Zn concentration of 5.0 to 40.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute.

<4>
The surface treated copper foil according to the item <3>, wherein the Zn concentration is from 10.0 to 30.0 atm %.

<5>
The surface treated copper foil according to any one of items <1> to <4>,
wherein the first surface treatment layer has an integrated value of a Ni concentration of 0.1 to 18.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

<6>
The surface treated copper foil according to any one of items <1> to <5>,
wherein the first surface treatment layer has an integrated value of a Zn concentration of 5.0 to 40.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

<7>
The surface treated copper foil according to any one of the items <1> to <6>,
wherein the first surface treatment layer has a sum of integrated values of Ni and Zn concentrations of 10.0 to 45.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

<8>
The surface treated copper foil according to any one of the items <1> to <7>,
wherein the first surface treatment layer has a Cu concentration of 70 to 98 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 7 minutes.

<9>
The surface treated copper foil according to any one of the items <1> to <8>, wherein the first surface treatment layer has a ten-point average roughness Rz according to JIS B0601:1994 of 0.4 to 1.2 μm.

<10>
The surface treated copper foil according to any one of the items <1> to <9>, wherein the first surface treatment layer satisfies at least one of the following items (A) to (E):
(A) a root mean square height Sq of 0.20 to 0.32 μm;
(B) a reduced valley depth Svk of 0.31 to 0.38 μm;
(C) an average length of roughness curve elements RSm according to JIS B0601:2013 of 5 to 10 μm;
(D) an average length of roughness motifs AR according to JIS B0631:2000 of 6 to 20 μm; and
(E) L* of a CIE L*a*b* color space measured according to the geometric condition C of JIS Z8730:2009 of 39.0 to 94.0.

<11>
The surface treated copper foil according to any one of the items <1> to <10>, wherein the copper foil is a rolled copper foil.

<12>
A copper clad laminate including
the surface treated copper foil according to any one of the items <1> to <11>, and
an insulating substrate adhered to the first surface treatment layer of the surface treated copper foil.

<13>
A printed circuit board including a circuit pattern formed by etching the surface treated copper foil of the copper clad laminate according to the item <12>.

REFERENCE SIGN LIST

1 Surface treated copper foil
2 Copper foil
3 First surface treatment layer
4 Second surface treatment layer
10 Copper clad laminate
11 Insulating substrate
20 Resist pattern

The invention claimed is:

1. A surface treated copper foil comprising a copper foil, and a first surface treatment layer formed on one surface of the copper foil,
wherein the first surface treatment layer comprises a Ni concentration of 0.1 to 15.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute.

2. The surface treated copper foil according to claim 1, wherein the Ni concentration is from 1.0 to 3.5 atm %.

3. The surface treated copper foil according to claim 1, wherein the first surface treatment layer comprises a Zn concentration of 5.0 to 40.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 1 minute.

4. The surface treated copper foil according to claim 3, wherein the Zn concentration is from 10.0 to 30.0 atm %.

5. The surface treated copper foil according to claim 1, wherein the first surface treatment layer comprises an integrated value of a Ni concentration of 0.1 to 18.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

6. The surface treated copper foil according to claim 1, wherein the first surface treatment layer comprises an integrated value of a Zn concentration of 5.0 to 40.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

7. The surface treated copper foil according to claim 1, wherein the first surface treatment layer comprises a sum of integrated values of Ni and Zn concentrations of 10.0 to 45.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

8. The surface treated copper foil according to claim 1, wherein the first surface treatment layer comprises a Cu concentration of 70 to 98 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 7 minutes.

9. The surface treated copper foil according to claim 1, wherein the first surface treatment layer comprises a ten-point average roughness Rz according to JIS B0601:1994 of 0.4 to 1.2 μm.

10. The surface treated copper foil according to claim 1, wherein the first surface treatment layer satisfies at least one of the following items (A) to (E):
(A) a root mean square height Sq of 0.20 to 0.32 μm;
(B) a reduced valley depth Svk of 0.31 to 0.38 μm;
(C) an average length of roughness curve elements RSm according to JIS B0601:2013 of 5 to 10 μm;
(D) an average length of roughness motifs AR according to JIS B0631:2000 of 6 to 20 μm; and
(E) L* of a CIE L*a*b* color space measured according to the geometric condition C of JIS Z8730:2009 of 39.0 to 94.0.

11. The surface treated copper foil according to claim 1, wherein the copper foil is a rolled copper foil.

12. A copper clad laminate comprising the surface treated copper foil according to claim 1, and
an insulating substrate adhered to the first surface treatment layer of the surface treated copper foil.

13. A printed circuit board comprising a circuit pattern formed by etching the surface treated copper foil of the copper clad laminate according to claim 12.

14. The surface treated copper foil according to claim 3, wherein the first surface treatment layer comprises an integrated value of a Ni concentration of 0.1 to 18.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

15. The surface treated copper foil according to claim 14, wherein the first surface treatment layer comprises an integrated value of a Zn concentration of 5.0 to 40.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

16. The surface treated copper foil according to claim 15, wherein the first surface treatment layer comprises a sum of integrated values of Ni and Zn concentrations of 10.0 to 45.0 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) in a period of 1 minute to 2 minutes.

17. The surface treated copper foil according to claim 16, wherein the first surface treatment layer comprises a Cu concentration of 70 to 98 atm % based on the total amount of elements of C, N, O, Zn, Cr, Ni, Co, Si, and Cu, in an XPS depth profile obtained by performing sputtering at a sputtering rate of 2.5 nm/min (in terms of $SiO_2$) for 7 minutes.

18. The surface treated copper foil according to claim 17, wherein the first surface treatment layer comprises a ten-point average roughness Rz according to JIS B0601:1994 of 0.4 to 1.2 μm.

* * * * *